United States Patent
Garrigus

(10) Patent No.: US 6,333,000 B1
(45) Date of Patent: Dec. 25, 2001

(54) PROCESS FOR MAKING LAMNO₃-COATED CERAMICS

(75) Inventor: Darryl F. Garrigus, Seattle, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 08/463,883

(22) Filed: Jun. 5, 1995

Related U.S. Application Data

(60) Division of application No. 07/945,191, filed on Sep. 15, 1992, now Pat. No. 5,549,850, which is a continuation-in-part of application No. 07/381,498, filed on Jul. 18, 1989, now abandoned, and a continuation-in-part of application No. 07/325,269, filed on Mar. 17, 1989, and a continuation-in-part of application No. 07/012,858, filed on Jan. 9, 1987, now abandoned, and a continuation-in-part of application No. 07/106,746, filed on Oct. 8, 1987, now Pat. No. 5,198,282, and a continuation-in-part of application No. 07/527,600, filed on May 23, 1990, now abandoned, said application No. 07/381,498, is a continuation-in-part of application No.06/698,496, filed on Feb. 5, 1985, now Pat. No. 5,041,321, which is a continuation-in-part of application No. 06/667,568, filed on Nov. 2, 1984, now abandoned, said application No. 07/325,269, is a continuation-in-part of application No.07/155,358, filed on Feb. 12, 1988, now abandoned.

(51) Int. Cl.⁷ ............................................... C23C 14/14
(52) U.S. Cl. ...................... 264/621; 427/595; 427/597
(58) Field of Search ................................. 264/432, 489, 264/434, 56, 61, 66, 621; 156/272.2, 89; 427/595, 597

(56) References Cited

U.S. PATENT DOCUMENTS

| | | |
|---|---|---|
| 3,330,697 | 7/1967 | Pechini |
| 3,640,093 | 2/1972 | Levene et al. |
| 3,819,468 | 6/1974 | Sauder et al. |
| 3,935,060 | 1/1976 | Blome et al. |
| 4,238,257 | 12/1980 | Remi et al. |
| 4,597,170 | 7/1986 | Isenberg |
| 4,784,686 | 11/1988 | Meek et al. |
| 4,849,276 | 7/1989 | Bendig et al. |
| 4,861,345 | 8/1989 | Bowker et al. |
| 5,000,998 | 3/1991 | Bendig et al. |
| 5,009,822 | 4/1991 | Sacks et al. |
| 5,021,369 | 6/1991 | Ackerman et al. |
| 5,061,402 | 10/1991 | Olson et al. |
| 5,106,654 | 4/1992 | Isenberg |
| 5,126,319 * | 6/1992 | Sen ....................................... 505/1 |
| 5,128,284 | 7/1992 | Olson et al. |

FOREIGN PATENT DOCUMENTS

| | | |
|---|---|---|
| 63-248022 | 10/1988 | (JP) . |
| 1-131025 | 5/1989 | (JP) . |

OTHER PUBLICATIONS

Proceedings of the 4$^{th}$ Annual Conference on fossil energy materials published Aug. 1990, Janney et al "Microwave sintering of fuel cell materials", compiled by Oak Ridge National Laboratory.*

Eror, et al., *Polymeric Precursor Synthesis of Ceramic Materials*, Proc. Mat'ls Res. Soc., *Better Ceramics Through Chemistry* (Brinker et al. [ed.]), 1986.

* cited by examiner

Primary Examiner—Blaine Copenheaver

(57) ABSTRACT

Processes are provided for forming composites comprising a LaMnO₃ perovskite coatings (or a related perovskite) on a mat of ceramic particles (e.g., fibers, microballoons, or mixtures thereof) or LaMnO₃-family sol-gel binders infused into the mat to form the connecting, rigidifying bridges.

3 Claims, No Drawings

PROCESS FOR MAKING LAMNO₃-COATED CERAMICS

REFERENCE TO RELATED APPLICATIONS

This U.S. patent application is a divisional application based upon U.S. patent application Ser. No. 07/945,191, filed Sep. 15, 1992, now U.S. Pat. No. 5,549,850, which was a continuation-in-part of application Ser. No. 07/381,498, abandoned, filed Jul. 18, 1989, which was a continuation-in-part of U.S. patent application Ser. No. 06/698,496, filed Feb. 5, 1985, now U.S. Pat. No. 5,041,321, which in turn is a continuation-in-part of U.S. patent application Ser. No. 06/667,568, filed Nov. 2, 1984, now abandoned. This application is also a continuation-in-part of U.S. patent application Ser. No. 07/325,269, pending, filed Mar. 17, 1989, (a continuation-in-part of U.S. patent application Ser. No. 07/155,358, filed Feb. 12, 1988, now abandoned); U.S. patent application Ser. No. 07/012,585, abandoned, filed Jan. 9, 1987; U.S. patent application Ser. No. 07/106,746, filed Oct. 8, 1987, now U.S. Pat. No. 5,198,282; and U.S. patent application Ser. No. 07/527,600, filed May 23, 1990, abandoned. Each application or patent is incorporated by reference.

TECHNICAL FIELD

This invention relates generally to a process for making ceramics coated with $LaMnO_3$ or a related ceramic, to ceramics rigified by $LaMnO_3$-family sol-gels, or to ceramics containing $LaMnO_3$-family ceramics.

BACKGROUND OF THE INVENTION

Superconducting ceramic oxides (i.e., the IBM 1-2-3 superconductors) are perovskite ceramics and are a recent technological breakthrough with promising applications in a wide range of areas. Superconductors are materials which transmit electricity without significant resistive losses and can sustain high magnetic fields when cooled below their superconducting transition temperature, $T_C$. The new class of superconducting ceramic oxides (sometimes also called superconducting mixed metal oxides or superconducting metal oxides) typically exhibit superconductivity at ambient pressure above 77° K. (−321° F.), the temperature of liquid nitrogen, which signifies the ability to prepare and maintain superconductive materials now in virtually any laboratory. Being superconductors at "high" temperatures is a tremendous advantage since the previously known superconductors only exhibited this property if they were cooled with liquid helium, which is expensive and difficult to handle.

Using superconducting ceramic oxides, it is often difficult to produce large, mechanically stable, complex shapes, or any stable shapes for that matter. Hence, commercial adoption of these superconductor ceramic oxides has been slower than the promise and potential foreseen when they were first discovered. The superconducting ceramic oxides are brittle, difficult to handle without damaging the ceramic (the materials lack glass formers and have low tensile strengths), and particularly difficult to form into a wire or fiber, the most desired form for high current applications. For small scale applications (such as for microcomponents for electronic devices) low current carrying superconducting ceramic oxides may be made in the form of single crystals. The technology for making large single crystals suitable for high current industrial, however, uses is not yet practical.

U.S. patent application Ser. No. 07/381,498 (abandoned), describes a method of manufacturing superconductive fiberformed ceramic composites which exhibit superconductivity at liquid nitrogen temperatures, which do not require high temperature consolidation of the superconducting metal oxide powder, and which can be produced in large complex shapes at relatively low cost. The present application describes related perovskite fiberform ceramics or coated ceramics that substitute sols from the $LaMnO_3$-family for the superconductive sols earlier used. The family of $LaMnO_3$ sols includes pure $LaMnO_3$ sols and those sols doped with varying amounts of strontium or chromium or both. The dopants provide charge carriers to produce sols and corresponding ceramic oxides having tailorable electrical conductivities as reported by R. Koc in his Master's Thesis: "Structural, Sintering and Electrical Conductivity Studies of the $LaCrO_3$-$LaMnO_3$ System, May 1986, University of Missouri-Rolla, incorporated by reference.

SUMMARY OF THE INVENTION

The present invention provides a process for forming a novel class of ceramics and the resulting products. The process involves, in one preferred embodiment, forming a slurry of ceramic particles in a suitable carrier; dispersing the slurry over a form-defining porous surface; felting out of the slurry a mat of the ceramic particles; drying the mat; contacting the dried mat with a $LaMnO_3$-family sol; and drying and curing the sol and mat to form the fiberform or microform ceramic. The ceramic particles may be in fiber or particle form, including microballoons, and can be mixtures of fibers and particles.

Another embodiment of the method includes forming the slurry of ceramic particles; forming a mat (i.e., a felted fiberform or microform ceramic) from the slurry; drying the mat; contacting the mat with a sol-gel ceramic precursor binder; drying and curing the mat to convert the precursor to a ceramic; and finally contacting the ceramic composite with a $LaMnO_3$-family sol which is subsequently cured and converted to the coating on the fiberform or microform.

Another embodiment involves making a fiberform or microform ceramic or a syntactic foam using some or all coated ceramic particles. The coated particles are made by contacting the particles with a $LaMnO_3$-family sol to form the coating, drying the coating, and, optionally, sintering the coating. The coated particles are then either dispersed in a slurry for felting a fiberform/microform ceramic or mixed with a suitable organic resin to form a syntactic foam. If felted, the mat is densified or made rigid with a suitable sol-gel binder. If mixed with the resin, the resin is cured to complete the syntactic foam. Coated particles comprise all or part of the particules in either product.

A microwave sintering method for obtaining the correct crystal structure of the ceramic is also described. The process is effective because the perovskite structure is a strong absorber of microwave energy so rapid heating occurs once the conversion begins. Therefore, the process is easier to use than conventional resistive heating to the 800–2400° F. (427–1316° C.) temperatures needed for the sintering.

DETAILED DESCRIPTION

In this application, the term "sol" will have its accepted technical meaning; a solution comprising the dispersion of a solid phase in a carrier liquid. The term "gel" will have its accepted technical meaning; a solution of a liquid that is polymerized by thermal or chemical means into a porous solid. As further used herein, the term "gel" will denote a heat-set or otherwise chemically-set gel produced from a sol.

Such a gel is ductile, flexible and can be handled. We will use "gel" in the this way to distinguish from its non-heat-set or non-chemically-set form which is thick, viscous, pourable, and castable, a condition we refer to as a "sol-gel."

We may use "particles" and "fibers" interchangeably (i.e., as synonyms) especially when referring to the constituents of the felt mat. Please understand that this mat can be all fibers, all particles, or mixtures of fibers and particles irrespective of the shorthand names we use in the specification.

In our earlier patents that are incorporated by reference, we described methods for making fiberform or microform porous ceramics that are felted mats of ceramic fibers, particles (including microballoons), or both rigidified using sol-gel binders to link the fibers, particles, or mixed fibers and particles much like glue but through typically glass forming ceramics rather than organic resins. The sol-gel ceramic binders which are used and which can be cured to form a ceramic are known in the art. For example, U.S. Pat. No. 3,640,093 discloses a method of preparing silicon oxides by forming a gel from hydrolized silicon alkoxide and a metal salt. Various sol-gel binders which can be used in the present invention include conventional sols and sol-gels used to form alumina, silica, mullite, zirconia, silicon nitride, or mixtures thereof. In a preferred embodiment of the present invention, the binder is a $LaMnO_3$-family sol or sol-gel.

Similar sol-gels for making superconductive metal oxides, which are also perovskites, are disclosed in commonly assigned copending application Ser. No. 07/325,269 (pending), filed Mar. 17, 1989, which is incorporated by reference. These types of sol-gels can be cured by heat treatment to form perovskite ceramics having desirable properties.

For convenience of description, the preferred embodiments of the present invention will be described in connection with the preparation of three preferred types of composites, arbitrarily called Type A, Type B, and Type C.

Type A

Ceramic particles (e.g., fibers, microballoons, or mixtures) are slurried with a suitable liquid, like water. Any liquid that does not detrimentally interact or react with the particles can be used because the liquid is just a carrier. The process involved is described in greater detail in U.S. Pat. No. 5,041,321, which is incorporated by reference.

The solid content of the slurry is not critical since the purpose of slurry is only to suspend the particles so that they may be uniformly distributed upon a form-defining surface in a felting operation. The size of the particles is also a matter of choice, depending upon the ultimate use of the composite. Particle size in an average of 30 to 400 mesh will be conveniently useful.

In felting, the slurry is dispersed over a form-defining porous surface (i.e., mold), including surfaces with hollow interiors such as cylinders or cones. Then, a substantial portion of the carrier is removed from the slurry, thereby forming a soft mat consisting of the ceramic particles, usually by drawing a vacuum through the porous surface which acts as a filter for the particles. Any other felting process also likely is suitable for making the "green" felt mat.

There are other methods of removing the liquid from the slurry while forming the mat of the desired shape, such as spraying the slurry onto a porous surface, but those methods are not preferred because ultimately a dry mat is desired and process steps like spraying do not withdraw as much water as the vacuum filtration or felting step on the mold which we describe.

The felt mat is heated to evaporate the remaining liquid, which in the case of water, means the temperature is raised to about 160° F. (71° C.) or higher and is maintained for several hours. The duration of drying will, of course, depend on the size, shape and depth of the mat. We prefer to dry the mat slowly so that it will not crumble from boiling liquid or steam as it is driven from the mat, and, therefore, prefer temperatures around 160° F. (71° C.).

A conventional sol-gel binder next is infused into the dry mat, soaking the particles at least at the intersections or contact points between particles ultimately form connections. Usually a light coating of the sol-gel binder is applied, with an air gelation used thereafter to initial stabilize the mat (by converting the sol-gel to a true "gel") and then the temperature is raised to the appropriate curing temperature to cure the gel to form a true ceramic. Usually such curing temperatures are in the range of about 500 to 700° F. (260 to 371° C.), preferably about 600° F. (316° C.). The stabilizing process rigidifies or densifies the mat by creating mechanical bridges between the particles, thereby increasing the strength of the mat. A porous ceramic fiberform or microform material of relatively low density is the result.

Generally the sol-gel is introduced into the mat by wicking, spraying, or vacuum-infiltrating.

Curing the sol-gel binder involves forming a gel from the binder by air-drying, then heating the mat to about 200° F. (93° C.) for about four hours, before slowly increasing the temperature to about 600° F. (316° C.) over a five hour period, and finally by rapidly reducing the temperature (quenching) to achieve a stabilizing set of binder in the mat, making the mat rigid rather than friable. To avoid brittleness, this cure might be done in a non-oxidizing environment, such as in ammonia. After this initial stabilization step, additional steps of sol-gel infusion and controlled cure may be performed to increase mechanical strength and density of the composite material and to adjust the properties of the ceramic, as explained in our earlier patents. Preferably, two or three additional binder applications will be used.

The ceramic particles are preferably selected from silica, alumina, mullite, zirconia, aluminosilicate, silicon nitride, or mixtures thereof which may be used at different concentrations, as desired. The length and diameter of the ceramic particles, particularly as fibers, are conveniently about 1/16" to 4" while the diameter is conveniently in the range of between 1 and 3 micrometers. Preferred fibers are about 1/4" in length and about 1 micrometer in diameter.

Microballoons are also commonly used, in which case the ceramic product is similar to the product described in U.S. patent application Ser. No. 07/527,600 (abandoned), which is incorporated by reference. Diatoms can be used in substitution for the ceramic particles or in combination (i.e., mixtures) with the fibers or microballoons. Phenolic or other similar microballoons may be used in which case they burn out during the subsequent sintering heat treatment of the $LaMnO_3$-family sol to leave hollow castes. Microballoons typically have diameters of about 20–150 micrometers in the products we prefer. They can be a single size (uniform) or a mixture of particles within this range.

To this point we have prepared, then, a conventional fiberform or microform ceramic. Next, this ceramic is coated with a $LaMnO_3$-family ceramic by infusion from the sol-gel to form the Type A product. The infusion process copies that used for the conventional sol-gel binder. Here, however, a coating of the $LaMnO_3$ sol results on the fibers/particles and the bridges. The $LaMnO_3$-family sol is dried and sintered to the desired perovskite structure generally in a microwave treatment process which will be described with respect to the Type B product.

The initial sol-gel binder preferably comprises a mixture of the conventional type, generally made from metal salts according to the method of Yoldas, Ceramic Bulletin, vol. 54, No. 3, p. 289–290 (1975). For a true $LaMnO_3$ sol, the sol-gel binder would include lanthanum carbonate or acetate and manganese formate in water or a mixture of ethylene glycol and citric acid. Nitrates of the metals may be used with hydrochloric acid (and ethylene glycol) or nitrates and/or acetates of the metals, with polyacrylic acid and ethylene glycol. Similar sols are described with reference to 1-2-3 superconductors in copending U.S. patent application Ser. No. 07/325,269 (pending) to Ronald Stephenson, which is incorporated by reference.

Type B

A fiberform or microform ceramic of the types described in U.S. Pat. No. 5,041,321, for example, or copending U.S. patent application Ser. No. 07/381,498 (abandoned) is prepared where the sol-gel binder for connecting the particles is a $LaMnO_3$-family sol rather than the alumina sol we commonly use. A sol-gel for forming a $LaMnO_3$-family perovskite ceramic is infused into the green felt mat generally by wicking one or more applications and the infused ceramic is dried in a sequential microwave drying process while monitoring the temperature within the ceramic. The temperature is a measure of the degree of formation of the desired perovskite structure for the gelled and cured sol. The proper crystal structure is essential to obtain the proper electrical conductivity and emissivity. Typically, the infused ceramic is heated in a 700 watt, 2.45 GHz microwave oven for 140 second pulses to first dry the sol-gel over the fibers/microballoons of the ceramic and then to sinter the gelled precursor to the perovskite structure where the $LaMnO_3$-family ceramic will become a strong absorber of the microwave radiation (and will get hot rapidly). Between each pulse, the ceramic is allowed to cool to ambient temperature. Typically the drying/sintering will take 4–5 pulses before the operation is complete. Initially the ceramic will reach a temperature of around 130–160° F. (54–71° C.) while in the later stages the temperature will exceed 1700° F. (927° C.). Unlike SiC whiskers that are a competing emissivity agent for ceramics, the $LaMnO_3$-family perovskites do not degrade in conductivity upon exposure to temperatures in excess of 1200° F. (649° C.). Instead, they can be used repeatedly in temperature cycling above 2000° F. (1093° C.). The $LaMnO_3$-family emissivity agents of the present invention also are much cheaper to produce and are less of a health hazard.

The microwave pulsing (or other control of the duty cycle of the microwave magnetron) allows the sol-gel first to dry by slowly ramping the drying temperature up to about 600° F. (316° C.) and, then, to sinter at temperatures between about 800–2400° F. (427–1316° C.).

As an alternate to the single soak infusion, the ceramic can be dried with the initial pulses (typically one or two pulses for 140 sec) sufficient to set the sol-gel but insufficient to sinter it and then infused with additional sol-gel to develop a thicker coating of perovskite in the fiberform or microform. Care should be taken to limit the temperature achieved during drying because, if the sintering starts, the temperature will increase rapidly and further infusion will require use of conventional ovens to control the temperatures.

In some cases, the $LaMnO_3$-family sol-gel binder or dispersant can be used in a syntactic foam product, wherein a syntactic foam is a dispersion of microspheres, typically glass microballoons, in an organic resin binder. In making syntactic foams, the microspheres generally are not felted because the resin binder is too thick to infuse into the felt mat. Rather, the resin binder and microspheres are mixed together prior to resin cure. The $LaMnO_3$-family sol-gel, here not acting as a binder but more as a coating as with the Type A product, can be applied the microspheres prior to their being mixed with the resin binder or may be infused into the syntactic foam product after mixing of the resin with the microspheres and curing of the resin.

In these resulting fiberform, microform, or syntactic foam products, the $LaMnO_3$-family sol provide a tailorable emissivity agent which is an effective replacement for more expensive SiC whiskers that commonly are used today in ceramics to achieve desired emissivity characteristics.

The $LaMnO_3$ sol typically must be thinned from its common viscous state (similar to the thickness of honey) to one closer in viscosity to that of water by adding about 20 vol. % glacial acetic acid relative to the $LaMnO_3$ sol, warming the sol-acid solution to about 110° F.–160° F. (43–71° C.), and adding similarly heated deionized water to the sol-acid to achieve the desired viscosity. If too thick the sol will not infuse into the mat or will not be sprayable. A clear $LaMnO_3$ sol free from crystallization may not require this acid/water thinning before it can be used.

In one respect, the present invention involves a method for tailoring the electrical conductivity or emissivity of the $LaMnO_3$ ceramic which results from changes in the crystal structure (i.e., formation of the perovskite) through sintering. Such changes dramatically alter the properties of the material, so sintering must be controlled. That is, during the infusing and drying to a sol-gel or gel, the $LaMnO_3$ product should not be sintered to the perovskite structure until all desired infusions are completed. To sinter, the infused mat is heated above 800° F. (427° C.) to as high a temperature as the matrix material (i.e., the ceramic particles) can withstand, or typically to a temperature of about 2400° F. (1316° C.).

Of course, with syntactic foams that use organic resin binders, temperature of 800–2400° F. (427–1316° C.) would destroy the resin binder, so, there, the sintering usually must be done by coating the glass microspheres prior to their mixing with the organic resin binder.

Because $LaMnO_3$-family perovskites are strong microwave absorbers, our preferred process for sintering involves sequential pulsing of the infused mat in a microwave oven with monitoring of the temperature within the mat after each session or pulse. Tables I and II show typical experimental results of the temperature profiles we have measured using a 700 watt, 2.45 GHz microwave oven at high power for each pulse (or the duty cycle of the magnetron can be adjusted to fire the magnetron for anywhere from 10–100% of the activation time).

TABLE I

Ceramic particles: glass eccospheres
Coating: $LaMnO_3$ sol
Duration of microwave pulse: 140 sec/application
Sample size: 10 g

| Pulse No. | Temperature following pulse (° F.) |
|---|---|
| 1 | 130 |
| 2 | 140 |
| 3 | 160 |
| 4 | 415 |
| 5 | 800 |
| 6 | 1700 |

TABLE II

Ceramic particles: HSA fibers coated with LaMnO$_3$ sol
Duration of microwave pulse: 140 sec/application
Sample size: 10 g

| Pulse No. | Temperature following pulse (° F.) |
| --- | --- |
| 1 | 160 |
| 2 | 200 |
| 3 | 600 |
| 4 | 2450 |
| 5 | 2400 |

Between pulses the samples were allowed to cool to ambient temperature. Temperature is measured with a probe inserted into the sample after the pulse.

Silicon carbide whiskers are also strong microwave absorbers and heat rapidly in a microwave oven. SiC whiskers, however, degrade (i.e., loss their capacity to absorb microwave radiation) if the whiskers are exposed to extended periods above about 1200° F. (649° C.) without degrading.

In the experiments of Tables I and II, the products were, respectively LaMnO$_3$ coated eccospheres and LaMnO$_3$ coated HSA (alumina+silica) fibers. The particles were essentially free of bridging. The products were candidate materials for adding to uncoated fiberform or microform particles for use in ceramics or syntactic foams. We have also prepared mats having LaMnO$_3$-family bridges with this process by pulsing the mat in the oven, but we do not present that data here.

The thickness of the LaMnO$_3$-family sol on the particles affects the number of cycles needed to achieve the sintering and the final conductivity/emissivity of the product. In addition, as Koc shows in his thesis, the selection of the actual LaMnO$_3$-family sol (i.e., the amount of strontium and chormium substituted respectively for lanthanum and manganese as dopants) affects the conductivity. We prefer a sol to form $(La_{0.9}Sr_{0.1})(Cr_{0.5}Mn_{0.5})O_3$ because this sol has virtually no change of conductivity over a temperature range from about 100–2227° C. Such a sol is made by mixing:

| | |
| --- | --- |
| 25.77 g | lanthanum carbonate; |
| 1.85 g | strontium carbonate; |
| 11.32 g | manganese formate; and |
| 17.69 g | chromium formate | in citric acid, ethylene glycol, and water according to the Stephenson process we describe in U.S. patent application Ser. No. 07/325,269 (pending), "METHOD FOR PRODUCING SUPERCONDUCTIVE OXIDE COMPOUNDS" and also as described with respect to forming fibers in U.S. patent application Ser. No. 07/606,110 (abandoned), "WHISKER-REINFORCED CERAMIC AND SUPERCONDUCTOR FIBERS FROM PRECERAMIC SOL-GEL, LIQUID MIX, AND POLYMER PRECURSORS."

In making such a sol-gels, a solution is first prepared containing soluble salts of the metals ultimately required in the mixed metal oxide superconductor. These salts are preferably soluble in water or in a water-miscible alcohol, such as methanol, ethanol, isopropanol, ethylene glycol, or the like. The appropriate salts include those which provide, as a counterion to the metal ion, an ion which is removable by evaporative methods, or at least the hydrolysis product of which is removable by counterions such as the acetates and formates, as well as counterions which evolve as gases at an appropriate pH, such as the carbonates. To assist in solubilizing the metal salts, polyhydroxy compounds, such as ethylene glycol, and organic acids, such as citric acid, malonic acid, acetic acid, and the like, may be added to form the metal salt solution. These polyhydroxy compounds and organic acids retain metal salts in solution, since some salts would precipitate under subsequent distillation conditions. Exemplary salts of those metals include, but are not limited to:

| | Soluble in |
| --- | --- |
| lanthanum carbonate | water (acid pH); EG/CA |
| lanthanum acetate | water |
| strontium formate | water |

EG/CA=ethylene glycol and citric acid

It is contemplated that in some instances an appropriate soluble salt of a desired metal may not be readily available. In such cases an available insoluble metal halide, such as the metal chloride, may be used to prepare a colloidal metal hydroxide which, in turn, may be later added to the peptized hydroxide sol containing the other metals required for the making of the LaMnO$_3$-family ceramic. For example, a metal chloride may be reacted with water to form a colloidal metal hydroxide. The colloidal metal hydroxide may be separated from an ammonium chloride solution and then added to the sol containing the other hydroxides or oxides of the other metals. Exemplary halide salts which maybe utilized in this manner include, but are not limited to:

strontium fluoride strontium iodide strontium bromide lanthanum chloride.

After preparation of the solution of soluble metal salts, if water is not already present in the solution, water is then added and the solution is subjected to hydrolyzing conditions whereby the counterions of the metal ions, or their hydrolysis products, are converted to moieties which are removable, by evaporative methods, such as by evolution of gas, or by evaporation of alcohols or organic acid. Evaporation may normally be done by distillation whereby the organic products are removed from the metals along with a substantial portion of the organic solvent and water. Subsequent to or simultaneously with distillation, the metals are converted by heating to oxides to form a mixed metal oxide precursor for the superconductor material.

The mixed metal oxide precursor, which is then typically a homogeneous semi-solid, is peptized to a sol, or fluid colloidal system, usually by addition of a strong mineral or organic acid, such as concentrated nitric acid, hydrochloric acid, lactic acid, and the like. This peptization step is usually conducted by heating at a temperature of less than about 212° F. (100° C.). At this time, metal colloidal gel, prepared by reacting metal halide and water, may be added to provide the metal or metals for which there were no available soluble salts. During this peptization process, the polymeric chains of the inorganic oxides are then formed.

As a final step, the mixed oxide coated composite in the desired hard-gelled shape, is fired at a temperature and for a period of time sufficient to oxidize and volatilize any remaining vapors and organic materials, thereby leaving an intact, dense, mixed metal oxide ceramic in its desired form. While this period of time will vary, usually one to six hours will suffice. Usually, the firing temperature will be in the range of about 1652–1832° F. (900–1000° C.), most preferably at about 1742° F. (950° C.). An annealing step at about 842° F. (450° C.) is also required.

Although not required, in some instances it is desirable to provide a high-pressure (1 atm, or greater) oxygen heat treatment at a temperature of about 1832–2012° F. (1000–1100° C.) to partially compensate the p-type semiconductor mixed metal oxide through a slight oxygen deficiency on the oxygen sublattice. Such a high-pressure oxygen firing would be desirable, for instance, to make sensitive components for solid state electronic devices.

Type C

A Type C material is made as described above in connection with Type A materials except that the starting particles include ceramic particles coated with a $LaMnO_3$-family sol and sintered as previously described. The coating is applied to a high-temperature ceramic particles such as zirconium oxide, alumina, Nextel 440 and the like, all of which are known in the art. The volume loading of the coated particles will depend upon the application of the composite and may be as high as 100%, i.e., the fibrous component of the composite would be all coated fibers. The felted particles are bonded together with the sol-gel ceramic precursor binder as described in the Type A material. Syntactic foams can also be prepared with these coated materials in the conventional processes for making such foams.

To form the coated fibers/particles the fibers/particles are mixed with the $LaMnO_3$-family sol and excess liquid is removed. The fibers/particles are spread and separated in a processing tray to limit the overlap or contact that would produce bridges during cure and, as described in Tables I and II, the sol is cured with microwave energy. Thickness can be built up by subjecting the particles to less than a sintering heat and recontacting the particles with the $LaMnO_3$-family sol. As a final step the temperature is allowed above 800° F. (427° C.) to achieve the crystal structural conversion to the desired perovskite form.

Having described the preferred embodiments of the invention, other modifications and alternative embodiments will be apparent, which will be within the spirit and scope of the present invention. The invention is not to be limited except in the scope of the following claims.

I claim:

1. A process for sintering a ceramic selected from the group consisting of $LaMnO_3$, $LaCrO_3$, $(La_{0.9}Sr_{0.1})(Cr_{0.5}Mn_{0.5})O_3$, and mixtures thereof to achieve perovskite crystal structure comprising the step of heating the ceramic with microwave pulses to a temperature between about 800–2400° F. (427–1316° C.) to sinter the ceramic.

2. The process of claim 1 wherein microwave pulses are at 700 W and 2.45 GHz for 140 sec and wherein the ceramic is allowed to cool to ambient between microwave pulses.

3. A sintering process for preparing a perovskite ceramic, comprising the steps of:

(a) coating a substrate with a sol containing precursors of the perovskite ceramic, the sol being susceptible to heating by absorbing microwave radiation;

(b) exposing the coated substrate to microwave radiation for pulses of selected duration to sinter the sol to a perovskite ceramic by heating the coated substrate to a temperature above 800° F.

* * * * *